United States Patent
Lee et al.

(10) Patent No.: US 10,572,059 B2
(45) Date of Patent: Feb. 25, 2020

(54) DISPLAY DEVICE HAVING A TOUCH SENSOR AND DRIVING METHOD THEREOF

(71) Applicant: Samsung Display Co., Ltd., Yongin-si (KR)

(72) Inventors: Il Ho Lee, Yongin-si (KR); Sang Min Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 29 days.

(21) Appl. No.: 15/479,410

(22) Filed: Apr. 5, 2017

(65) Prior Publication Data

US 2018/0067606 A1  Mar. 8, 2018

(30) Foreign Application Priority Data

Sep. 7, 2016 (KR) .......................... 10-2016-0115107

(51) Int. Cl.
  *G06F 3/041* (2006.01)
  *G06F 3/044* (2006.01)
  *G02F 1/1333* (2006.01)
  *H01L 27/32* (2006.01)

(52) U.S. Cl.
  CPC ............ *G06F 3/0416* (2013.01); *G06F 3/044* (2013.01); *G06F 3/0412* (2013.01); *G02F 1/13338* (2013.01); *G06F 3/0414* (2013.01); *G06F 2203/04105* (2013.01); *G06F 2203/04111* (2013.01); *G06F 2203/04112* (2013.01); *H01L 27/323* (2013.01)

(58) Field of Classification Search
  CPC ................... G06F 3/044; G06F 3/0412; G06F 2203/04111
  See application file for complete search history.

(56) References Cited

U.S. PATENT DOCUMENTS

| | | | |
|---|---|---|---|
| 8,988,384 B2 | 3/2015 | Krah et al. | |
| 2017/0075493 A1* | 3/2017 | Lee | G06F 3/0418 |
| 2017/0090630 A1* | 3/2017 | Kim | G06F 3/0412 |
| 2017/0242536 A1* | 8/2017 | Wang | G06F 3/0416 |
| 2017/0262125 A1* | 9/2017 | Ding | G06F 3/044 |
| 2017/0344143 A1* | 11/2017 | Huppi | G06F 3/04883 |
| 2019/0064955 A1* | 2/2019 | Wang | G06F 3/044 |

* cited by examiner

*Primary Examiner* — Yuzhen Shen
(74) *Attorney, Agent, or Firm* — H.C. Park & Associates, PLC

(57) ABSTRACT

A display device and a driving method thereof, in which the display device includes a display panel including a plurality of pixels electrically connected to data lines and scan lines, a touch sensor including a plurality of touch electrodes, a touch controller for supplying a first driving signal to the touch sensor during a display period, and a data driver for supplying a data signal to the data lines during the display period, and supplying a second driving signal to the data lines during a pressure sensing period.

16 Claims, 10 Drawing Sheets

DISPLAY DEVICE HAVING A TOUCH SENSOR AND DRIVING METHOD THEREOF

CROSS-REFERENCE TO RELATED APPLICATION

This application claims priority from and the benefit of Korean Patent Application No. 10-2016-0115107, filed on Sep. 7, 2016, which is hereby incorporated by reference for all purposes as if fully set forth herein.

BACKGROUND

Field

Exemplary embodiments of the present disclosure relate to a display device having a touch sensor and a driving method thereof.

Discussion of the Background

As interest in information displays and demand for portable information media increase, research and commercialization has centered on display devices.

Recent display devices include touch sensors for receiving touch inputs of users in addition to image display functions. Accordingly, the users can more conveniently use the display devices through the touch sensors.

In addition, various functions have recently been provided to users using not only the position of a touch, but also the pressure generated by the touch.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device and a driving method thereof, which can detect a position and a pressure of a touch.

Exemplary embodiments also provide a display device and a driving method thereof in which it is not necessary to provide a separate pressure sensor because a data driver and data lines are used to detect a pressure of a touch. Accordingly, it is possible to reduce the manufacturing cost of the display device and to decrease the thickness of the display device.

Additional aspects will be set forth in the detailed description which follows, and, in part, will be apparent from the disclosure, or may be learned by practice of the inventive concept.

An exemplary embodiment of the present disclosure discloses a display device including: a display panel including a plurality of pixels electrically connected to data lines and scan lines; a touch sensor including a plurality of touch electrodes; a touch controller configured to supply first driving signals to the touch sensor during a display period; and a data driver configured to supply data signals to the data lines during the display period, and supply second driving signals to the data lines during a pressure sensing period.

The display device may further include a scan driver configured to supply scan signals to the scan lines during the display period.

The scan driver may not supply of the scan signals during the pressure sensing period.

The touch controller may detect a position of a touch using first sensing signals output from the touch sensor during the display period, and detect a pressure of the touch using second sensing signals output from the touch sensor during the pressure sensing period.

The frequency of the first driving signals and the frequency of the second driving signals may be equal to each other.

The touch controller may supply the first driving signals to the touch sensor during the display period and the pressure sensing period.

The touch controller may detect a position of a touch using the first sensing signals output from the touch sensor during the display period, and detect a position of a touch and a pressure of the touch using the second sensing signals output from the touch sensor during the pressure sensing period.

The frequency of the first driving signals and the frequency of the second driving signals may be different from each other.

The touch controller may separate the second sensing signals into a plurality of sub-sensing signals having frequencies different from each other, and detect the position of the touch and the pressure of the touch using the respective sub-sensing signals.

The touch sensor may be a capacitive type touch sensor.

The data driver may supply the same second driving signals to all of the data lines during the pressure sensing period.

The display panel may be a liquid crystal display panel or an organic light emitting display panel.

At least some of the touch electrodes and at least some of the data lines may overlap with each other.

An exemplary embodiment of the present disclosure also discloses a method for driving a display device, the method including: respectively supplying data signals and scan signals to data lines and scan lines during a display period included in a frame period, the data lines and the scan lines being electrically connected to pixels of a display panel, and supplying first driving signals to a touch sensor; and simultaneously supplying the same second driving signals to the data lines during a pressure sensing period included in the frame period.

The method may further include detecting a position of a touch using the first sensing signals output from the touch sensor during the display period, and detecting a pressure of the touch using the second sensing signals output from the touch sensor during the pressure sensing period.

The method may further include: supplying the first driving signals to the touch sensor during the pressure sensing period; and detecting a position of a touch using first sensing signals output from the touch sensor during the display period, and detecting a positions of a touch and a pressure of the touch by performing frequency separation on second sensing signals output from the touch sensor during the pressure sensing period.

The frequency of the first driving signals and the frequency of the second driving signals may be different from each other.

The touch sensor may be located on the display panel, and include a plurality of touch electrodes.

At least some of the touch electrodes and at least some of the data lines may be located to overlap with each other.

The touch sensor may be a capacitive type touch sensor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
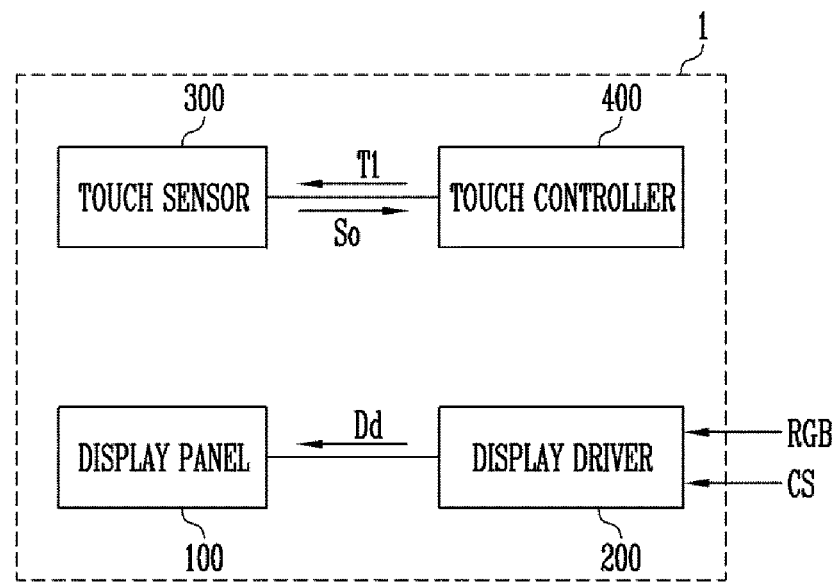
FIG. 1 is a view illustrating a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
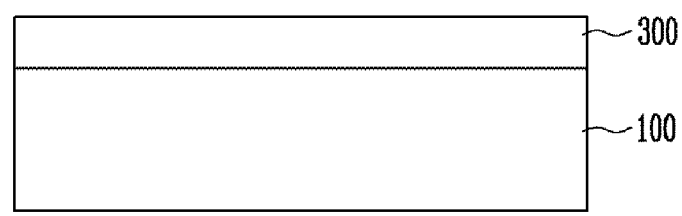
FIG. 2 is a view illustrating an arrangement structure of a display panel and a touch sensor according to an exemplary embodiment of the present disclosure.

FIG. 1 is a view illustrating a display device according to an exemplary embodiment of the present disclosure. FIG. 2 is a view illustrating an arrangement structure of a display panel and a touch sensor according to an exemplary embodiment of the present disclosure.

Referring to FIG. 1, the display device 1 according to the exemplary embodiment of the present disclosure may include a display panel 100, a display driver 200, a touch sensor 300, and a touch controller 400.

The display panel 100 includes a plurality of pixels, and may display a predetermined image with the pixels.

For example, the display panel 100 may display an image under the control of the display driver 200.

In addition, the display panel 100 may be implemented as an organic light emitting display panel, a liquid crystal display panel, a plasma display panel, or the like, but the present disclosure is not limited thereto.

The display driver 200 may control an image display operation of the display panel 100 by supplying a display driving signal Dd to the display panel 100.

The display driver 200 may generate the display driving signal Dd using image data RGB and a control signal CS, which are supplied from the outside.

For example, the display driver 200 may receive the image data RGB and the control signal CS supplied from a host (not shown), and the control signal CS may include a vertical synchronization signal, a horizontal synchronization signal, a main clock signal, and the like.

In addition, the display driving signal Dd may include a scan signal, a data signal, and the like.

For example, the display driver 200 may be connected to the display panel 100 through a separate component (e.g., a circuit board).

In another exemplary embodiment, the display driver 200 may be directly mounted on the display panel 100.

The touch sensor 300 may recognize a user's touch input to the display device 1.

Referring to FIG. 2, the touch sensor 300 is located on the display panel 100 to detect a user's touch input toward the display panel 100.

For example, the touch sensor 300 may detect a position and/or a pressure of a touch event that occurs therein.

In order to recognize a touch, the touch sensor 300 may include a plurality of touch electrodes.

For example, the touch sensor 300 may be a capacitive type touch sensor.

The touch controller 400 may control an operation of the touch sensor 300.

For example, the touch controller 400 may drive the touch sensor 300 by supplying a touch driving signal T1 to the touch sensor 300.

The touch controller 400 may calculate information (a position of a touch and/or a pressure of the touch) of a touch input to the touch sensor 300 using a sensing signal So output from the touch sensor 300.

For example, the touch controller 400 may detect the position of the touch using the sensing signal So output from the touch sensor 300 during a display period, and detect the pressure of the touch using the sensing signal So output from the touch sensor 300 during a pressure sensing period.

In another exemplary embodiment, the touch controller 400 may detect not only the pressure of the touch, but also the position of the touch using the sensing signal So output from the touch sensor 300 during the pressure sensing period.

Figure 3:
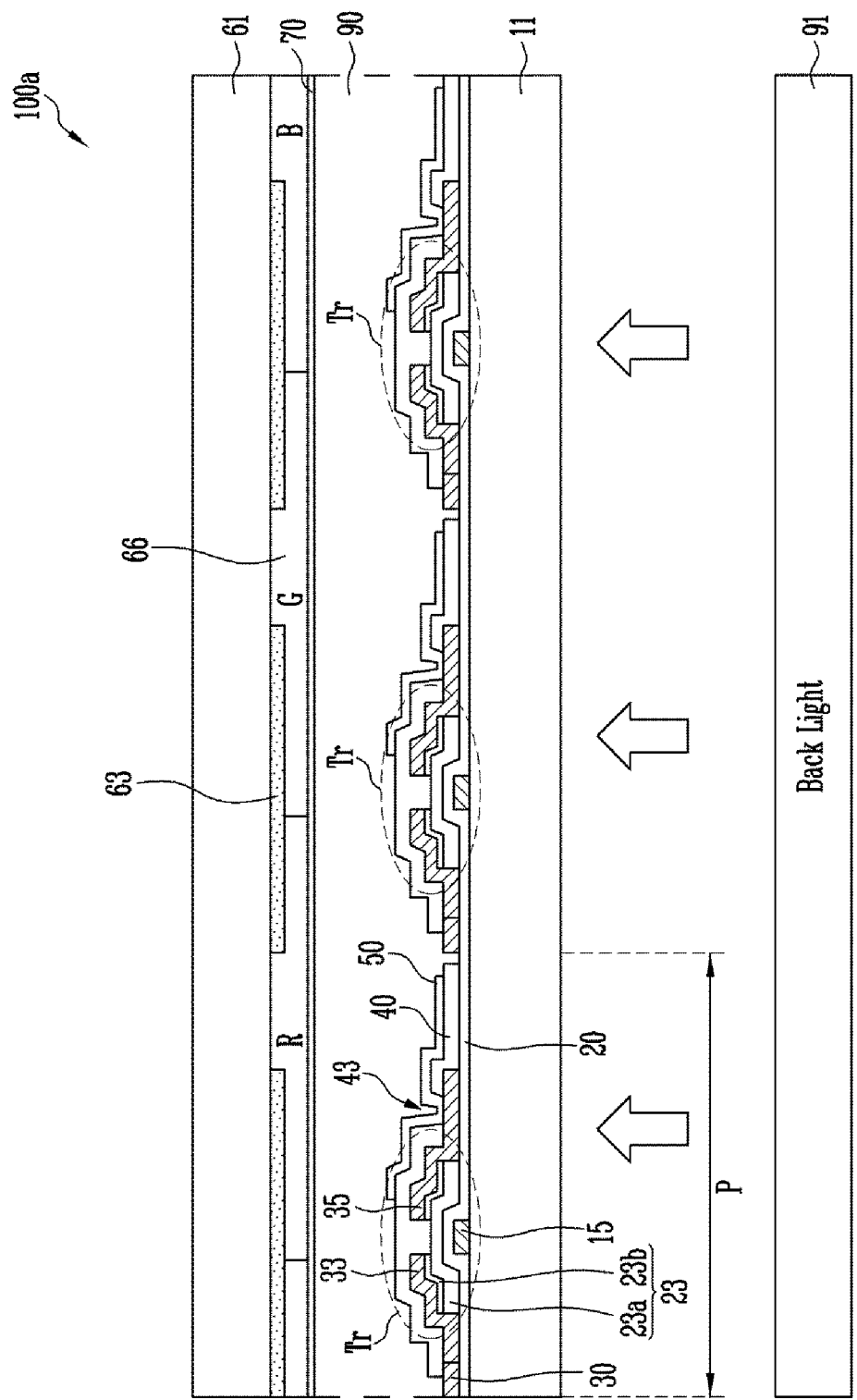
FIG. 3 is a sectional view of a display panel according to an exemplary embodiment of the present disclosure.

FIG. 3 is a sectional view of a display panel according to an exemplary embodiment of the present disclosure.

Referring to FIG. 3, the display panel 100 may be implemented as a liquid crystal display panel 100a.

The liquid crystal display panel 100a may implement an image using optical anisotropy and polarizing property of liquid crystals. The liquid crystal has optical anisotropy in which molecules of the liquid crystal have a thin and long structure and have directivity in the alignment thereof, and polarization property in which, when the molecules are placed in an electric field, the direction of the alignment of the molecules is changed depending on the size of the molecules.

The liquid crystal display panel 100a may include pixels P, a common electrode 70, a liquid crystal layer 90, a first substrate 11, and a second substrate 61. The liquid crystal display panel 100a may display an image by forming a predetermined electric field generated by a common voltage and a data signal between the common electrode 70 and pixel electrodes 50 of pixels P selected by a scan signal (or gate signal) and then adjusting the transmittance of light supplied from a back light 91 according to an alignment angle of the liquid crystals, changed by the electric field.

The liquid crystal display panel 100a may be implemented in a twisted nematic (TN) mode, a vertical alignment (VA) mode, an in plane switching (IPS) mode, a plane to line switching (PLS) mode, or the like according to a process of controlling an alignment of the liquid crystal layer 90.

Among these modes, the ISP mode and the PLS mode are modes in which the alignment of the liquid crystal layer is controlled by an electric field between the pixel electrodes 50 and the common electrode 70 by arranging both of the pixel electrodes 50 and the common electrode 70 on a lower substrate (e.g., the first substrate 11).

In FIG. 3, a case where the common electrode 70 is located on the second substrate 61 has been illustrated as an example. However, it will be apparent that the present disclosure may also be applied in the IPS mode and the PLS mode, in which the common electrode 70 is located together with the pixel electrodes 50 on the first substrate 11.

The pixel P may include a transistor Tr, a pixel electrode 50 connected to the transistor Tr, and a liquid crystal capacitor (not shown) formed between the pixel electrode 50 and the common electrode 70. In this case, the pixel P may further include a storage capacitor (not shown).

The transistor Tr, as shown in FIG. 3, may be configured to include a gate electrode 15 connected to a scan line (or gate line), source/drain electrodes 33 and 35, and a semiconductor layer 23 formed between the gate electrode 15 and the source/drain electrodes 33 and 35. The semiconductor layer 23 may include an active layer 23a and an ohmic contact layer 23b.

In addition, a gate insulating layer 20 is formed over the gate electrode 15, and a protective layer 40 is formed over the source/drain electrodes 33 and 35. The protective layer 40 may have a contact hole 43 through which the drain electrode 35 is exposed.

In addition, the pixel electrode 50 is formed on the protective layer 40. The pixel electrode 50 may be connected to the drain electrode 35 through the contact hole 43. In this case, the source electrode 33 may be connected to a data line 30.

In addition, the transistor Tr is not limited to the structure shown in FIG. 3, and may be modified to have another structure.

The liquid crystal capacitor may use the pixel electrode 50 and the common electrode 70 as two terminals, and the liquid crystal layer 90 between the two electrodes 50 and 70 may serve as a dielectric.

A lattice-shaped black matrix 63 surrounding regions of the respective pixels P to cover a non-display region in which lines, transistors Tr, and the like exist may be formed on a rear surface of the second substrate 61.

In addition, color filter patterns 66 arranged to correspond to the respective pixels P may exist inside the black matrix 63.

In this case, the color filter patterns 66 may include color patterns of red R, green G, and blue B, which are sequentially repeatedly arranged.

An overcoat layer (not shown) may be further formed between the color filter patterns 66 and the common electrode 70.

In addition, the positions of the black matrix 63 and the color patterns 66 may be changed. Therefore, when the black matrix 63 and the color patterns 66 are formed at different positions, the common electrode 70 may be formed on an inner surface of the second substrate 61.

The common electrode 70 is preferably formed of a transparent conductive material, but may be formed of another conductive material, such as an opaque metal.

For example, the common electrode 70 may be formed of indium tin oxide (ITO), indium zinc oxide (IZO), graphene, carbon nanotube, silver nanowires (AgNWs), or the like.

FIG. 3 illustrates one example where the common electrode 70 is located on the second substrate 61. However, the common electrode 70 may be located on the first substrate 11 instead of the second substrate 61.

In this case, the common electrode 70 may be formed in the same layer as the pixel electrode 50 or may be formed in a different layer from the pixel electrode 50 according to a liquid crystal mode.

Meanwhile, the back light 91 that provides light may be located under the first substrate 11.

Figure 4:
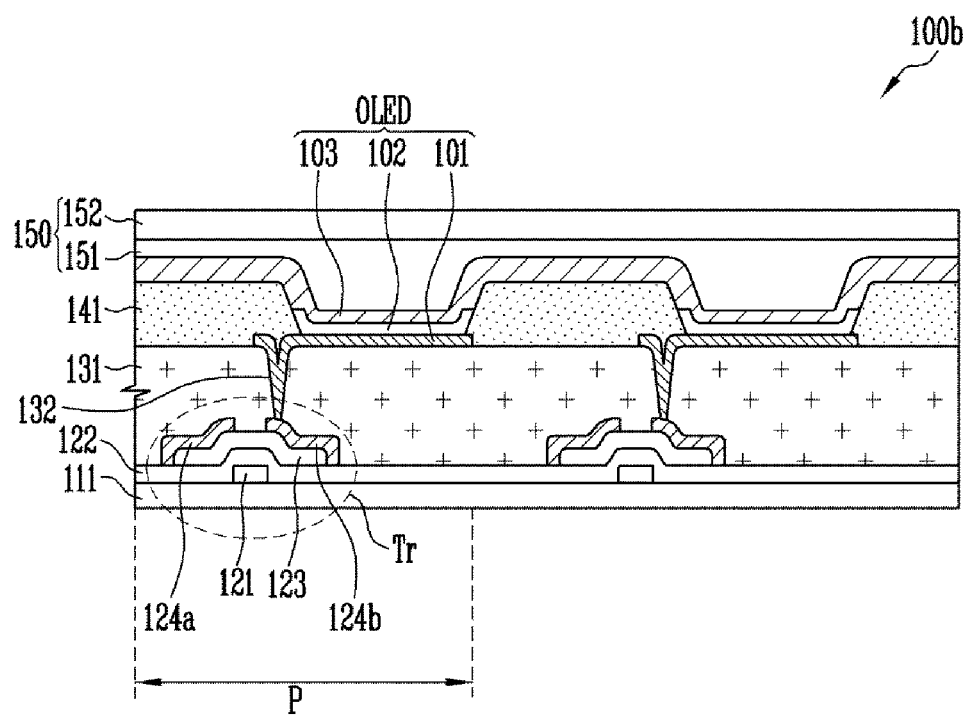
FIG. 4 is a sectional view of a display panel according to another exemplary embodiment of the present disclosure.

FIG. 4 is a sectional view of a display panel according to another exemplary embodiment of the present disclosure.

Referring to FIG. 4, the display panel 100 may be implemented as an organic light emitting display panel 100b.

Referring to FIG. 4, an organic light emitting diode OLED may include an anode electrode 101, a light emitting layer 102, and a cathode electrode 103.

The light emitting layer 102 may be located between the anode electrode 101 and the cathode electrode 103.

For example, the light emitting layer 102 may include an organic emission layer for self-luminescence.

In this case, the light emitting layer 102 may be formed in a structure in which a hole transporting layer, an organic emission layer, and an electron transporting layer are stacked. Additionally, the light emitting layer 102 may further include a hole injection layer and an electron injection layer.

According to the above-described structure, holes injected from the anode electrode 101 and electrons injected from the cathode electrode 103 are combined in the organic emission layer, thereby generating excitons, and light having a specific wavelength is generated in each light emitting layer 102 based on energy from the generated excitons.

The cathode electrode 103 may include a conductive material. For example, the conductive material may include metals, alloys thereof, a conductive polymer, a transparent conductive material, and the like.

A plurality of pixels P may be located on a substrate 111. In this case, the pixel P may be configured to include a pixel circuit (not shown) including a driving transistor Tr and the organic light emitting diode OLED.

For convenience of description, only the driving transistor Tr directly related to the organic light emitting diode OLED is illustrated in FIG. 4. However, in order to control emission of the organic light emitting diode OLED, the pixel circuit (not shown) may additionally have another transistor except the driving transistor Tr, a capacitor, and the like.

The driving transistor Tr is formed on the substrate 111, and may be disposed corresponding to each organic light emitting diode OLED.

The driving transistor Tr may include a gate electrode 121, a gate insulating layer 122, a semiconductor layer 123, and source/drain electrodes 124a and 124b.

The gate electrode 121 may be formed on the substrate 111.

The gate insulating layer 122 may be formed over the gate electrode 121. For example, the gate insulating layer 122 may be formed of an insulating material such as a silicon oxide layer ($SiO_x$) or a silicon nitride layer ($SiN_x$).

The semiconductor layer 123 may be formed on the gate insulating layer 122. For example, the semiconductor layer 123 may be formed of polysilicon obtained by crystallizing amorphous silicon using a laser.

In addition, the semiconductor layer 123 may be formed of amorphous silicon, an oxide semiconductor, or the like, in addition to the polysilicon.

The source/drain electrodes 124a and 124b may be located at both sides of the semiconductor layer 123.

A protective layer 131 may be located over the driving transistor Tr. The protective layer 131 may have a contact hole 132 through which the source electrode 124a or the drain electrode 124b is exposed. In FIG. 13, a case where the drain electrode 124b is exposed through the contact hole 132 has been illustrated as an example.

The gate electrode 121 and the source/drain electrodes 124a and 124b may be formed of a metal such as molybdenum Mo, tungsten W, titanium Ti, or aluminum Al, an alloy thereof, or a stack structure thereof, but the present disclosure is not limited thereto.

The anode electrode 101 is formed on the protective layer 131, and may be connected to the source electrode 124a or the drain electrode 124b through the contact hole 132. In FIG. 4, a case where the anode electrode 101 is connected to the drain electrode 124b through the contact hole 132 has been illustrated as an example.

For example, the protective layer 131 may be formed of an insulating material, such as silicon oxide or silicon nitride.

A pixel defining layer 141 may be located on the protective layer 131. Also, the pixel defining layer 141 may expose at least a partial region of the anode electrode 101 therethrough.

For example, the pixel defining layer 141 may be made of one of organic insulating materials such as acryl-based organic compound, polyamide, and polyimide. However, the present disclosure is not limited thereto, and the pixel defining layer 141 may be formed of various insulating materials.

An encapsulation layer 150 may be located on the organic light emitting diode OLED. Specifically, the encapsulation layer 150 may be located on the cathode electrode 103.

In addition, the encapsulation layer 150 may be formed as a structure in which a plurality of layers are stacked. In FIG. 4, a case where the encapsulation layer 150 includes one organic layer 151 and one inorganic layer 152 has been illustrated as an example. However, the encapsulation layer 150 may include a plurality of organic layers 151 and a plurality of inorganic layers 152. In this case, the organic layers 151 and the inorganic layers 152 may be alternately stacked.

Figure 5A:
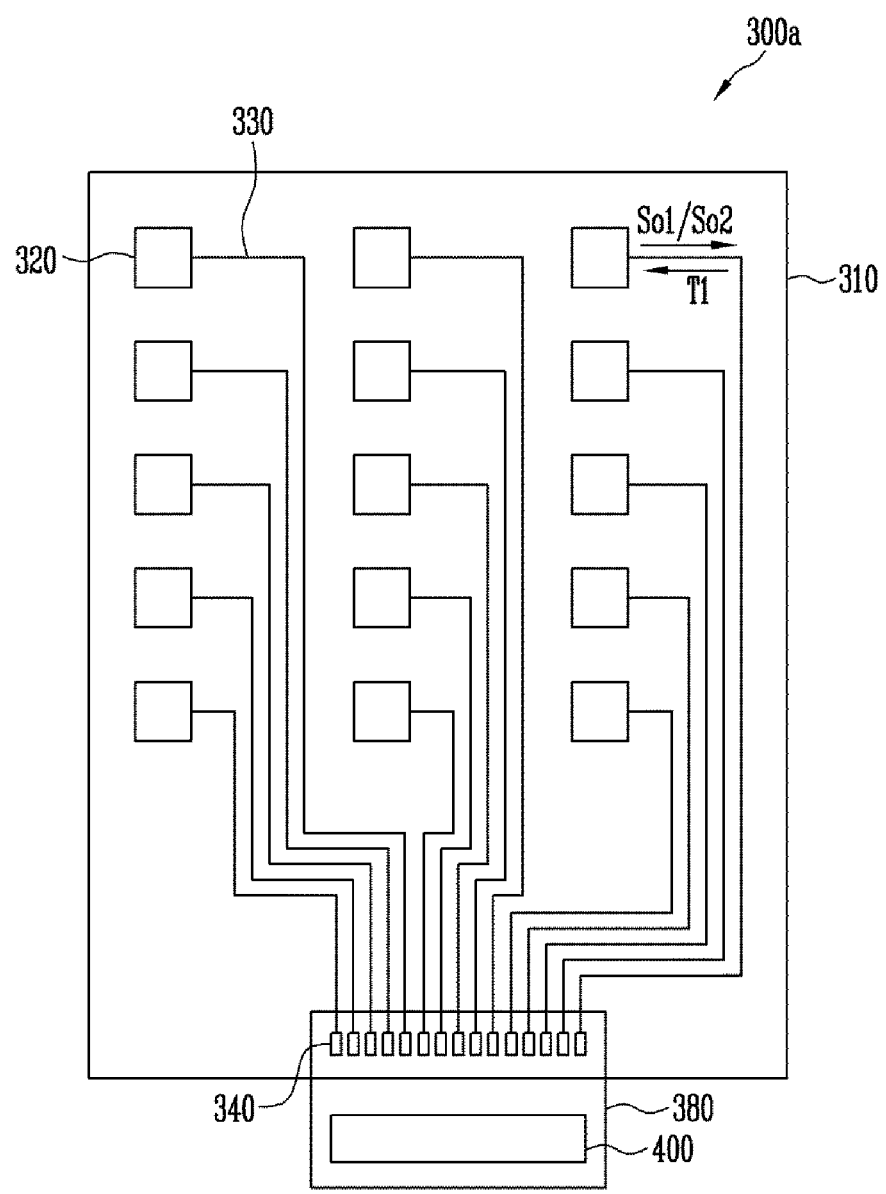
FIG. 5A and FIG. 5B are views illustrating touch sensors according to exemplary embodiments of the present disclosure.
Figure 5B:
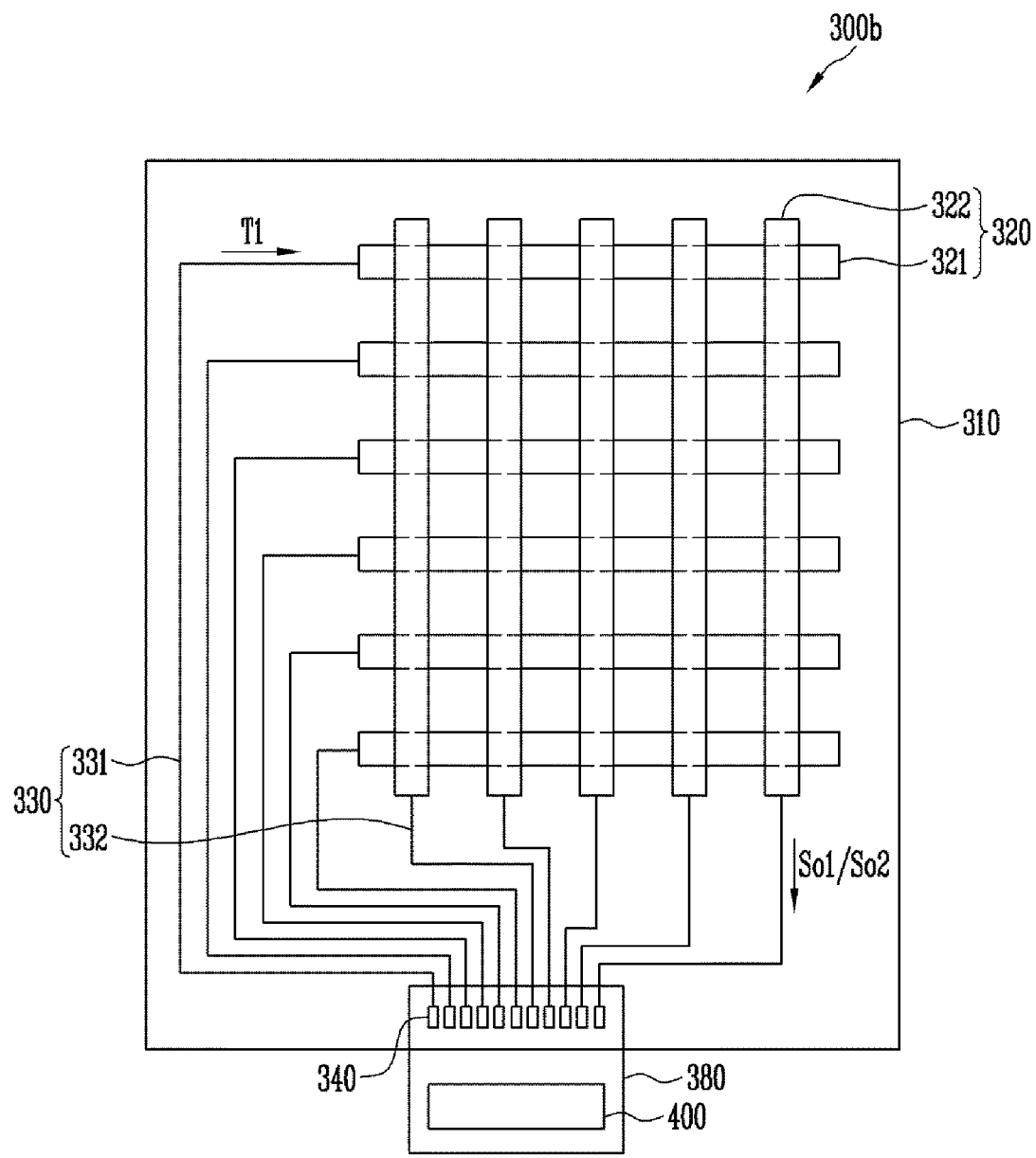

FIGS. 5A and 5B are views illustrating touch sensors according to exemplary embodiments of the present disclosure.

Referring to FIG. 5A, the touch sensor 300 may be a self-capacitive touch sensor 300a.

The touch sensor 300a may include a plurality of touch electrodes 320 and lines 330.

The touch electrodes 320 may be arranged on a substrate 310. The touch electrodes 320 may include a conductive material.

In an exemplary embodiment of the present disclosure, the conductive material may include metals or alloys thereof. The metals may include gold (Au), silver (Ag), aluminum (Al), molybdenum (Mo), chromium (Cr), titanium (Ti), nickel (Ni), neodymium (Nd), copper (Cu), platinum (Pt), and the like.

The touch electrodes 320 may be made of a transparent conductive material. The transparent conductive material may include silver nanowires (AgNWs), indium tin oxide (ITO), indium zinc oxide (IZO), antimony zinc oxide (AZO), indium tin zinc oxide (TIZO), zinc oxide (ZnO), tin oxide ($SnO_2$), carbon nano tube, graphene, and the like.

The substrate 310 may be made of an insulative material, such as glass or resin. Also, the substrate 310 may be made of a material having flexibility so as to be bendable or foldable. The substrate 310 may have a single-layered structure or a multi-layered structure.

For example, the substrate 310 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a plurality of various other materials may be utilized in the substrate 310, and the substrate 310 may be made of fiber glass reinforced plastic (FRP), or the like.

The substrate 310 may be implemented as a separate substrate, or may be implemented as one of various components included in the display device.

For example, the substrate 310 may be the second substrate 61 of the liquid crystal display panel 100a described above, or the encapsulation layer 150 of the organic light emitting display panel 100b described above.

In this case, the touch sensor 300a may be designed in an on-cell type. For example, the touch electrodes 320, the lines 330, and pads 340 may be arranged at an upper side of the display panel 100 (e.g., an upper side of the substrate 310).

In addition, the touch sensor 300a may be designed in an in-cell type. For example, the touch electrodes 320, the lines 330, and the pads 340 may be arranged in an inside of the display panel 100 (e.g., a lower side of the substrate 310).

The lines 330 may be connected between the touch electrodes 320 and the pads 340. The lines 330 may be connected to a touch controller 400 through the pads 340.

For example, the touch controller 400 may be connected to the pads 340 through a separate component, such as a flexible printed circuit board (FPCB) 380.

The touch electrodes 320 may receive a first driving signal T1 supplied from the touch controller 400, and output, to the touch controller 400, a sensing signal So to which a change in capacitance is reflected.

For example, the touch controller 400 may simultaneously supply the first driving signal T1 to the touch electrodes 320, or may supply the first driving signal T1 to the touch electrodes 320 in units of rows or columns at different times.

In addition, the touch controller 400 may supply the first driving signal T1 to the touch electrodes 320 during only the display period, or may supply the first driving signal T1 to the touch electrodes 320 during not only the display period but also the pressure sensing period.

In this case, the sensing signal So output from the touch electrodes 320 may include a first sensing signal So1 output during the display period and a second sensing signal So2 output during the pressure sensing period.

When a touch is input to the touch sensor 300a, the self-capacitance of touch electrodes 320 related to the touch is changed. Therefore, the touch controller 400 may detect a position and a pressure of a touch using the sensing signal So output from the touch electrodes 320.

For example, the touch controller 400 may detect a position of a touch occurring during the display period using the first sensing signal So1, and detect a pressure of a touch occurring during the pressure sensing period using the second sensing signal So2.

In another exemplary embodiment, the touch controller 400 may simultaneously detect a position and a pressure of a touch occurring during the pressure sensing period by performing frequency separation on the second sensing signal So2.

Referring to FIG. 5B, according to another exemplary embodiment of the present disclosure, the touch sensor 300 may be a mutual capacitive touch sensor 300b.

The touch sensor 300b may include touch electrodes 320 and lines 330.

The touch electrodes 320 may be arranged on a substrate 310. The touch electrodes 320 may include a conductive material.

The substrate 310 may be implemented as a separate substrate, or may be implemented as one of various components included in the display device.

For example, the substrate 310 may be the second substrate 61 of the liquid crystal display panel 100a described above or the encapsulation layer 150 of the organic light emitting display panel 100b described above.

In this case, the touch sensor 300a may be designed as an "on-cell" type. For example, the touch electrodes 320, the lines 330, and pads 340 may be arranged at an upper side of the display panel 100 (e.g., an upper side of the substrate 310).

In addition, the touch sensor 300a may be designed as an "in-cell" type. For example, the touch electrodes 320, the lines 330, and the pads 340 may be arranged in an inside of the display panel 100 (e.g., a lower side of the substrate 310).

In this case, the touch electrodes 320 may include first touch electrodes 321 and second touch electrodes 322, and the lines 330 may include first lines 331 and second lines 332.

The first touch electrodes 321 are formed long in a first direction, and may be arranged in plural numbers along a second direction intersecting the first direction.

The second touch electrodes 322 may operate as the mutual capacitive touch sensor together with the first touch sensors 321.

To this end, the second touch electrodes 322 may be arranged to intersect the first touch electrodes 321.

For example, the second touch electrodes 322 are formed long in the second direction, and may be arranged in plural numbers along the first direction.

Mutual capacitances between the first touch electrodes 321 and the second touch electrodes 322 are formed by the above-described arrangement of the first touch electrodes 321 and the second touch electrodes 322. When a touch is input to the touch sensor 300b, mutual capacitances related to the touch are changed.

In order to prevent contacts between the first touch electrodes 321 and the second touch electrodes 322, an insulating layer (not shown) may be formed between the first touch electrodes 321 and the second touch electrodes 322.

The insulating layer may be formed entirely between the first touch electrodes 321 and the second touch electrodes 322, or may be locally formed at intersection portions between the first touch electrodes 321 and the second touch electrodes 322.

The first touch electrodes 321 and the second touch electrodes 322 may be formed of a transparent conductive material, or of another conductive material, such as opaque metal.

For example, the first touch electrodes 321 and the second touch electrodes 322 may be formed of the same material as the above-described touch electrode 320.

FIG. 5B illustrates that the first touch electrodes 321 and the second touch electrodes 322 are formed in the shape of bars, but the shapes of the first touch electrodes 321 and the second touch electrodes 322 may be variously changed.

In addition, the first touch electrodes 321 and the second touch electrodes 322 may have a mesh structure so as to have flexibility.

The first lines 331 may be connected between the first touch electrodes 321 and the pads 340. Also, the second lines 332 may be connected between the second touch electrodes 322 and the pads 340.

In addition, the lines 331 and 332 may be connected to a touch controller 400 through the pads 340.

For example, the touch controller 400 may be connected to the pads 340 through a separate component such as an FPCB 380.

The first touch electrodes 321 may receive a first driving signal T1 supplied from the touch controller 400, and the second touch electrodes 322 may output, to the touch controller 400, a sensing signal So to which a change in capacitance is reflected.

For example, the touch controller 400 may simultaneously supply the first driving signal T1 to the first touch electrodes 321, or may sequentially supply the first driving signal T1 to the first touch electrodes 321.

In addition, the touch controller 400 may supply the first driving signal T1 to the first touch electrodes 321 during only the display period, or may supply the first driving signal T1 to the first touch electrodes 321 during not only the display period but also the pressure sensing period.

In this case, the sensing signal So output from the second touch electrodes 322 may include a first sensing signal So1 output during the display period and a second sensing signal So2 output during the pressure sensing period.

When a touch is input to the touch sensor 300b, the self-capacitance between touch electrodes 321 and 322 related to the touch is changed. Therefore, the touch controller 400 may detect a position and a pressure of a touch using the sensing signal So output from the second touch electrodes 322.

For example, the touch controller 400 may detect a position of a touch occurring during the display period using the first sensing signal So1, and detect a pressure of a touch occurring during the pressure sensing period using the second sensing signal So2.

In another exemplary embodiment, the touch controller 400 may simultaneously detect a position and a pressure of a touch occurring during the pressure sensing period by performing frequency separation on the second sensing signal So2.

Figure 6:
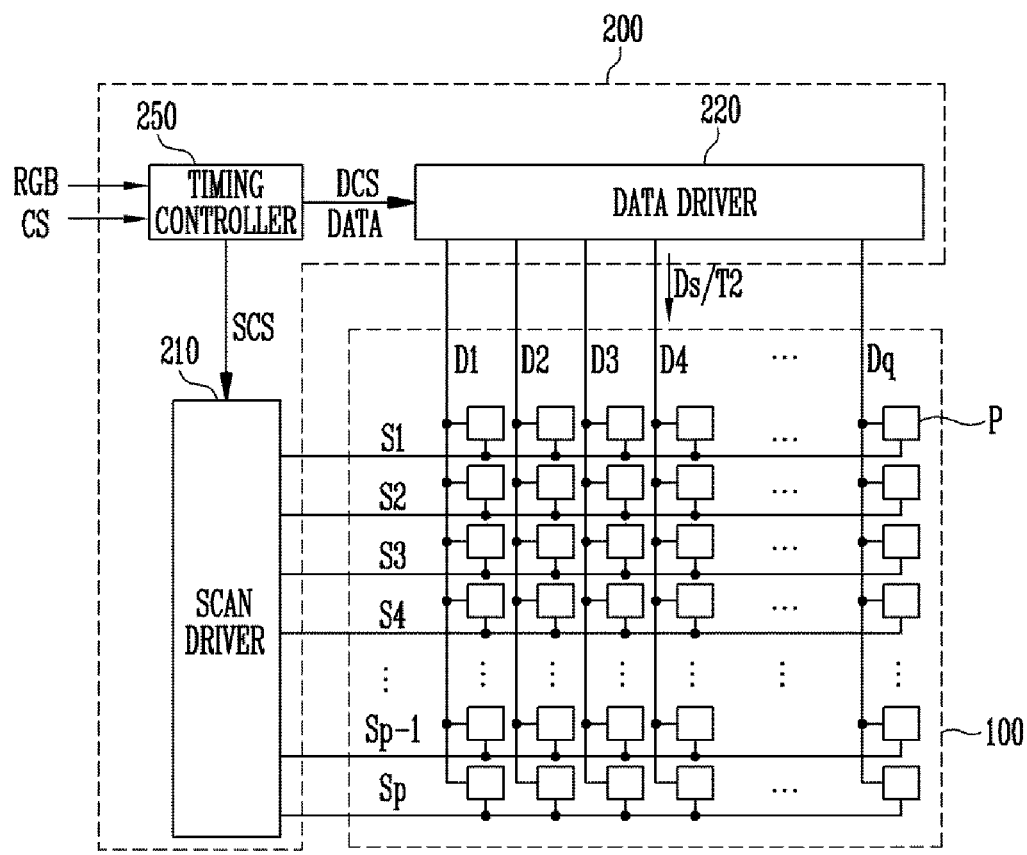
FIG. 6 is a view illustrating a display panel and a display driver according to an exemplary embodiment of the present disclosure.

FIG. 6 is a view illustrating a display panel and a display driver according to an exemplary embodiment of the present disclosure. For convenience of description, pixels P of the display panel 100 are mainly illustrated in FIG. 6.

Referring to FIG. 6, the pixels P may be connected to data lines D1 to Dq and scan lines S1 to Sp. For example, the pixels P may be arranged in a matrix form at intersection portions of the data lines D1 to Dq and the scan lines S1 to Sp.

The pixels P may receive data and scan signals supplied through the data lines D1 to Dq and the scan lines S1 to Sp.

The display driver 200 may include a scan driver 210, a data driver 220, and a timing controller 250.

The scan driver 210 may supply scan signals to the scan lines S1 to Sp during a display period in response to a scan driver control signal SCS. For example, the scan driver 210 may sequentially supply scan signals to the scan lines S1 to Sp.

In order to be connected to the scan lines S1 to Sp, the scan driver 210 may be directly mounted on the display panel 100, or may be connected to the display panel 100 through a separate component such as an FPCB.

The data driver 220 may receive a data driver control signal DCS and image data DATA from the timing controller 250 to generate a data signal Ds.

The data driver 220 may supply the generated data signal Ds to the data lines D1 to Dq.

For example, the data driver 220 may supply a data signal Ds for image display to each of the data lines D1 to Dq during the display period, and supply a second driving signal T2 for pressure sensing to each of the data lines D1 to Dq.

In order to be connected to the data lines D1 to Dq, the data driver 220 may be directly mounted on the display panel 100, or may be connected to the display panel 100 through a separate component such as an FPCB.

If a scan signal is supplied to a specific scan line, some pixels P connected to the specific scan line may receive a data signal Ds supplied from the data lines D1 to Dq. The some pixels P may emit light with a luminance corresponding to the received data signal Ds.

The timing controller 250 may generate control signals for controlling the scan driver 210 and the data driver 220.

For example, the control signals may include a scan driver control signal SCS for controlling the scan driver 210 and a data driver control signal DCS for controlling the data driver 220.

In this case, the timing controller 250 may generate the scan driver control signal SCS and the data driver control signal DCS using an external control signal CS.

In addition, the timing controller 250 may supply the scan driver control signal SCS to the scan driver 210, and supply the data driver control signal DCS to the data driver 220.

The timing controller 250 may convert image data RGB input from the outside into image data DATA suitable for specifications of the data driver 220, and supply the image data DATA to the data driver 220.

Although the scan driver 210, the data driver 220, and the timing controller 250 are separately illustrated in FIG. 6, at least some of the components may be integrated when necessary.

In addition, the scan driver 210, the data driver 220, and the timing controller 250 may be installed in various manners, including chip-on-glass, chip-on-plastic, a tape carrier package, chip-on-film, and the like.

Figure 7:
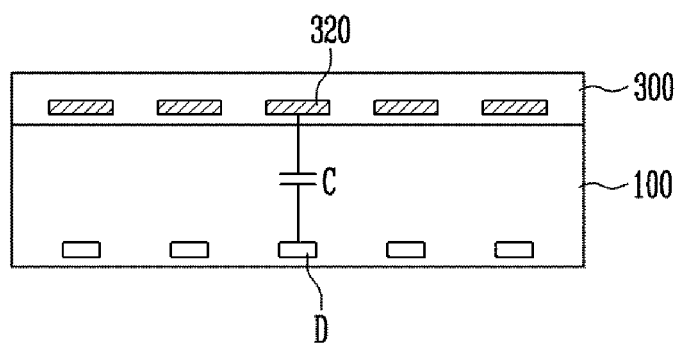
FIG. 7 is a view illustrating an arrangement structure of touch electrodes and data lines according to an exemplary embodiment of the present disclosure.

FIG. 7 is a view illustrating an arrangement structure of the touch electrodes and the data lines according to an exemplary embodiment of the present disclosure. For convenience description, the data lines D of the display panel 100 and the touch electrodes 320 of the touch sensor 300 are mainly illustrated in FIG. 7.

Referring to FIG. 7, at least some of the touch electrodes 320 and at least some of the data lines D may be positioned to overlap with each other.

Accordingly, the touch electrodes 320 and the data lines D, which overlap with each other, can serve as a capacitor, and a capacitance C may be formed between the touch electrodes 320 and the data lines D.

The capacitance C between the touch electrodes 320 and the data line D may be changed depending on a spacing distance between the touch electrodes 320 and the data lines D.

For example, when a touch occurs in the touch sensor 300, the distance between the touch electrodes 320 and the data lines D is changed corresponding to the pressure of the touch, and therefore, the capacitance C may be changed.

Consequently, as an external pressure increases, the capacitance C between touch electrodes 320 and the data lines D increases.

Accordingly, the touch controller 400 detects a variation in the capacitance C in the occurrence of a touch, so that it is possible to recognize the magnitude of a pressure generated by the touch.

For example, the touch controller 400 may detect a variation in capacitance using the second sensing signal So2 output during the pressure sensing period, and accordingly, the magnitude of a pressure of a touch can be detected.

Figure 8:
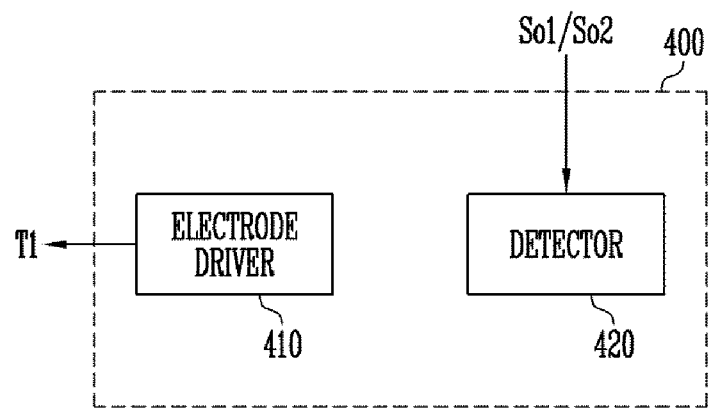
FIG. 8 is a view illustrating a touch controller according to an exemplary embodiment of the present disclosure.

FIG. 8 is a view illustrating a touch controller according to an exemplary embodiment of the present disclosure.

Referring to FIG. 8, the touch controller 400 according to the exemplary embodiment of the present disclosure may include an electrode driver 410 and a detector 420.

The electrode driver 410 may supply a first driving signal T1 to the touch sensor 300.

First, the touch sensor 300a shown in FIG. 5A will be described as an example. The electrode driver 410 may supply the first driving signal T1 to the touch electrodes 320 through the lines 330.

In addition, the touch sensor 300b shown in FIG. 5B will be described as an example. The electrode driver 410 may supply the first driving signal T1 to the first touch electrodes 321 through the first lines 331.

The electrode driver 410 may output the first driving signal T1 having a specific frequency.

For example, the electrode driver 410 may supply the first driving signal T1 to the touch sensor 300 during the display period.

The detector 420 may detect a position of a touch and/or a pressure of the touch using a sensing signal So output from the touch sensor 300.

Specifically, the detector 420 may detect a position of a touch occurring during the display period using a first sensing signal So1 output during the display period.

The detector 420 may detect a point at which a change in capacitance occurs to be equal to or greater than a threshold value, using the first sensing signal So1. The detector 420 may determine the detected point as the position of the touch.

For example, the detector 420 may detect the position of the touch using a level (e.g., a voltage level or current level) of the first sensing signal So1 to which the change in capacitance is reflected.

In addition, the detector 420 may detect a pressure of a touch occurring during the pressure sensing period, using a second sensing signal So2 output during the pressure sensing period.

The detector 420 may detect a variation in capacitance C (see FIG. 7), which exists between the touch electrodes 320 and the data lines D, using the second sensing signal So2. The detector 420 may calculate a magnitude of the pressure of the touch using the detected variation in capacitance.

For example, the detector 420 may detect the pressure of the touch using a difference between a reference value and a level (e.g., a voltage level or current level) of the second sensing signal So2 to which the change in capacitance is reflected.

Figure 9:
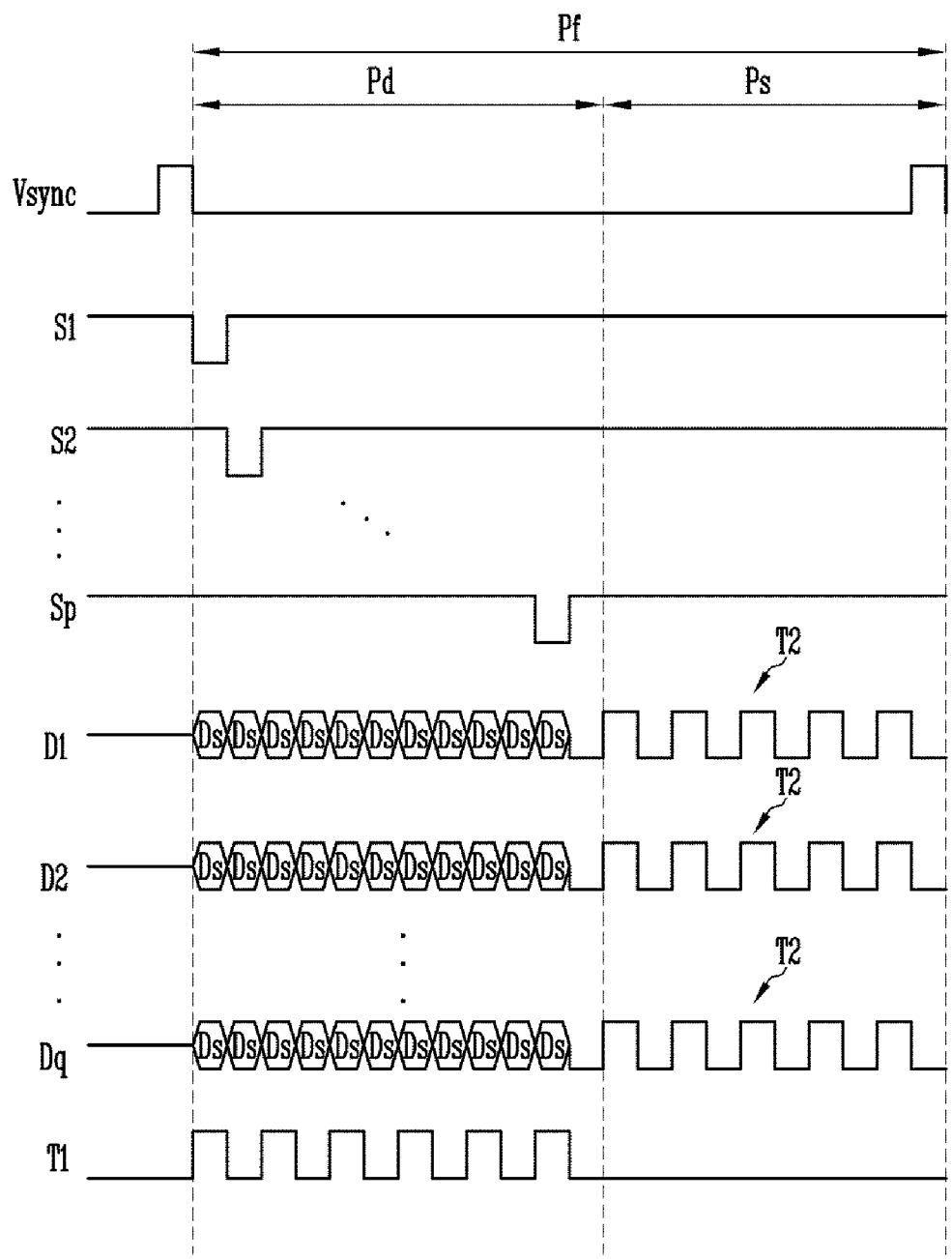
FIG. 9 is a waveform diagram illustrating a driving method of the display device according to an exemplary embodiment of the present disclosure.

FIG. 9 is a waveform diagram illustrating a driving method of the display device according to an exemplary embodiment of the present disclosure. Hereinafter, the driving method of the display device according to the exemplary embodiment of the present disclosure will be described with reference to FIG. 9.

A vertical synchronization signal Vsync is a signal that defines one frame period Pf. Therefore, one period of the vertical synchronization signal Vsync may be set to the one frame period Pf.

In this case, the one frame period Pf may include a display period Pd and a pressure sensing period Ps.

The display period is a period for image display, and a data signal Ds and a scan signal (e.g., a low-level signal) may be respectively applied to the data lines D1 to Dq and the scan lines S1 to Sp, which are connected to the pixels P of the display panel 100, during the display period Pd. FIG. 9 illustrates that the scan signal is a low-level signal. However, the scan signal may instead be set to a high-level signal.

In addition, a first driving signal T1 having a first frequency may be supplied to the touch sensor 300 during the display period Pd.

The pressure sensing period Ps is a period in which the supply of the scan signal and the data signal Ds is not provided to the scan lines S1 to Sp or the data lines D1 to Dq in order that a pressure may be detected, and may be referred to as a "blank period".

That is, instead of the data signal Ds, a second driving signal T2 may be supplied to the data lines D1 to Dq during the pressure sensing period Ps.

The data signal Ds may be set to a signal level corresponding to a gray level to be expressed. For example, when the display device 1 expresses 256 gray levels, the data signal Ds may have various levels respectively corresponding to gray levels designated from 0 to 255.

The second driving signal T2 may be set to a signal alternately having high and low levels. For example, the high level may be equal to the highest gray level of the data signal, and the low level may be equal to the lowest gray level of the data signal Ds.

In addition, the same second driving signal T2 may be simultaneously supplied to all of the data lines D1 to Dq during the pressure sensing period Ps.

The touch sensor 300 may output a first sensing signal So1 to the touch controller 400 during the display period Pd, and output a second sensing signal So2 to the touch controller 400 during the pressure sensing period Ps.

Therefore, the touch controller 400 may detect a position of a touch using the first sensing signal So1, and detect a pressure of the touch using the second sensing signal So2.

The second driving signal T2 may have a second frequency. That is, the period Pd for detecting the position of the touch and the period Ps for detecting the pressure of the touch are time-divisionally performed, and hence the first frequency of the first driving signal T1 and the second frequency of the second driving signal T2 may be set different from or equal to each other.

Figure 10:
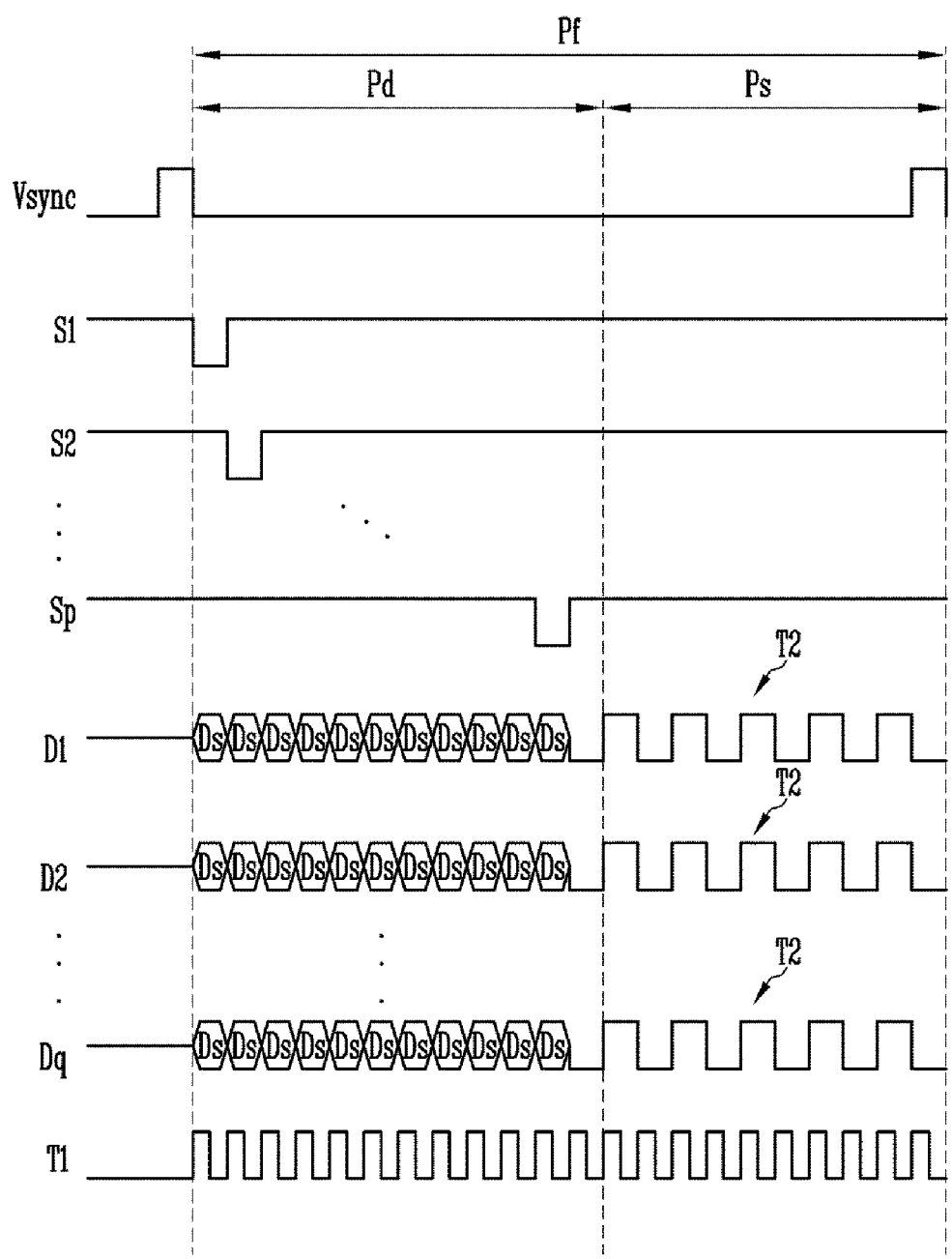
FIG. 10 is a waveform diagram illustrating a driving method of the display device according to another exemplary embodiment of the present disclosure.
Figure 11:
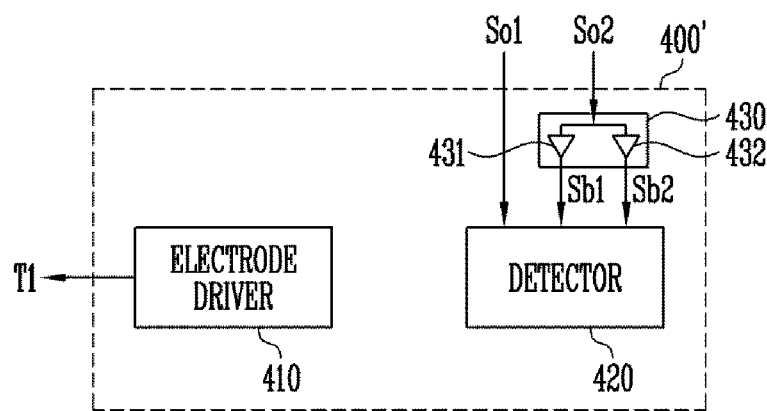
FIG. 11 is a view illustrating a touch controller according to another exemplary embodiment of the present disclosure.

FIG. 10 is a waveform diagram illustrating a driving method of the display device according to another exemplary embodiment of the present disclosure. FIG. 11 is a view illustrating a touch controller according to another exemplary embodiment of the present disclosure.

Referring to FIG. 10, in the driving method of the display device according to the another exemplary embodiment of the present disclosure, the first driving signal T1 may be supplied to the touch sensor 300 during not only the display period Pd but also the pressure sensing period Ps.

That is, the electrode driver 410 of the touch controller 400 may output the first driving signal T1 having the first frequency during only the display period Pd but also the pressure sensing period Ps.

In addition, the data signal Ds and the scan signal (e.g., a low-level signal) may be respectively applied to the data lines D1 to Dq and the scan lines S1 to Sp, which are connected to the pixels P of the display panel 100, during the display period Pd.

The second driving signal T2 having the second frequency may be supplied to the data lines D1 to Dq during the pressure sensing period Ps.

The first driving signal T1 and the second driving signal T2 are simultaneously supplied during the pressure sensing period Ps. Therefore, in order to perform frequency separation of the second sensing signal So2 output during the pressure sensing period Ps, the first frequency of the first driving signal T1 and the second frequency of the second driving signal T2 may be set different from each other.

For example, the first frequency may be set greater than the second frequency. On the contrary, the second frequency may be set to be greater than the first frequency.

Since only the first driving signal T1 is supplied to the touch sensor 200 during the display period Pd, the first sensing signal So1 may include a single frequency component (e.g., a first frequency component).

On the other hand, during the pressure sensing period Ps, the first driving signal T1 is supplied to the touch sensor 300, and the second driving signal T2 is supplied to the data lines D1 to Dq. Hence, the second sensing signal So2 may include multiple frequency components (e.g., the first frequency and the second frequency).

Therefore, the frequency separation of the second sensing signal So2 is to be first performed so as to separately detect a position of a touch and a pressure of the touch using the second sensing signal So2.

The detector 420 may detect a position of a touch using the first sensing signal So1 output during the display period Pd.

For example, the detector 420 may detect a point at which a change in capacitance occurs to be equal to or greater than a threshold value, using the first sensing signal So1. The detector 420 may determine the detected point as the position of the touch.

In addition, the detector 420 may simultaneously detect a position and a pressure of a touch, using the second sensing signal So2 output during the pressure sensing period Ps.

To this end, the touch controller 400' according to another exemplary embodiment of the present disclosure may further include a filter 430 for frequency separation of the second sensing signal So2.

The second sensing signal So2 may be separated into a first sub-sensing signal Sb1 and a second sub-sensing signal Sb2, which have frequencies different from each other.

For example, the first sub-sensing signal Sb1 may include a first frequency component, and the second sub-sensing signal Sb2 may include a second frequency component.

To this end, the filter 430 may include a first band pass filter that allows the first frequency component to pass therethrough and a second band pass filter 432 that allows the second frequency component to pass therethrough.

However, the frequency separation of the second sensing signal So2 may be implemented through various frequency separation techniques in addition to the above-described technique.

FIG. 11 illustrates that only the second sensing signal So2 is input to the filter 430. However, the first sensing signal So1 may also be input to the filter 430.

The detector 420 may detect a position of a touch using the first sub-sensing signal Sb1.

For example, the detector 420 may detect a point at which a change in capacitance occurs to be equal to or greater than a threshold value, using the first sub-sensing signal Sb1. The detector 420 may determine the detected point as the position of the touch.

In addition, the detector 420 may detect a pressure of a touch using the second sub-sensing signal Sb2.

For example, the detector 420 may detect a variation in capacitance C (see FIG. 7), which exists between the touch electrodes 320 and the data lines D, using the second sub-sensing signal Sb2. The detector 420 may calculate a magnitude of the pressure of the touch using the detected variation in capacitance.

Figure 12:
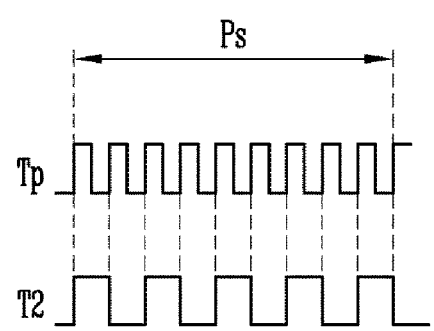
FIG. 12 is a waveform diagram illustrating a transfer pulse signal and a second driving signal according to an exemplary embodiment of the present disclosure.

FIG. 12 is a waveform diagram illustrating a transfer pulse signal and a second driving signal according to an exemplary embodiment of the present disclosure.

The transfer pulse signal Tp is a signal that determines an output timing of the data signal Ds. As shown in FIG. 12, the transfer pulse signal Tp may be used to determine an output timing of the second driving signal T2.

Thus, the timing controller 250 changes the frequency of the transfer pulse signal Tp, so that it is possible to easily change the frequency of the second driving signal T2 supplied during the pressure sensing period Ps.

For example, the frequency of the second driving signal T2 may be set to 1/n (n is a natural number) of the transfer pulse signal Tp. In FIG. 12, a case where n is 2 has been illustrated as an example.

In addition, a rising edge of the second driving signal T2 may correspond to that of the transfer pulse signal Tp.

The transfer pulse signal Tp may be included in the data driver control signal DCS supplied from the timing controller 250 to the data driver 220.

According to the present disclosure, it is possible to provide a display device and a driving method thereof which can detect a position and a pressure of a touch.

Also, according to the present disclosure, it is possible to provide a display device and a driving method thereof in which it is not necessary to provide a separate pressure sensor because a data driver and data lines are used to detect a pressure of a touch. Accordingly, it is possible to reduce the manufacturing cost of the display device and to decrease the thickness of the display device.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
    a display panel comprising a plurality of pixels electrically connected to data lines and scan lines;
    a touch sensor comprising a plurality of touch electrodes;
    a touch controller configured to supply first driving signals to the touch sensor during a display period and a pressure sensing period; and
    a data driver configured to supply data signals to the data lines during the display period, and supply second driving signals to the data lines during the pressure sensing period,
    wherein:
    frequencies of the first driving signals in the pressure sensing period and frequencies of the second driving signals in the pressure sensing period are different from each other; and
    the frequencies of the second driving signals in the pressure sensing period are greater than zero; and
    the frequencies of the first driving signals in the display period are greater than zero.

2. The display device of claim 1, further comprising a scan driver configured to supply scan signals to the scan lines during the display period.

3. The display device of claim 2, wherein the scan driver is configured to not supply the scan signals to the scan lines during the pressure sensing period.

4. The display device of claim 1, wherein the touch controller is configured to detect a position of a touch using first sensing signals output from the touch sensor during the display period, and detect a pressure of the touch using second sensing signals output from the touch sensor during the pressure sensing period.

5. The display device of claim 1, wherein the touch controller is configured to detect a position of a touch using the first sensing signals output from the touch sensor during the display period, and detect a position of a touch and a pressure of the touch using the second sensing signals output from the touch sensor during the pressure sensing period.

6. The display device of claim 5, wherein the touch controller is configured to separate the second sensing signals into a plurality of sub-sensing signals having frequencies different from each other, and detect the position of the touch and the pressure of the touch using the respective sub-sensing signals.

7. The display device of claim 1, wherein the touch sensor comprises a capacitive type touch sensor.

8. The display device of claim 1, wherein the data driver is configured to supply the same second driving signals to all of the data lines during the pressure sensing period.

9. The display device of claim 1, wherein the display panel comprises a liquid crystal display panel or an organic light emitting display panel.

10. The display device of claim 1, wherein at least some of the touch electrodes and at least some of the data lines overlap with each other.

11. A method for driving a display device, the method comprising:
    supplying first driving signals to a touch sensor during a display period included in a frame period;
    respectively supplying data signals and scan signals to data lines and scan lines, which are electrically connected to pixels of a display panel, during the display period;
    supplying the first driving signals to the touch sensor during a pressure sensing period included in the frame period; and
    simultaneously supplying second driving signals to the data lines during the pressure sensing period,
    wherein:
    frequencies of the first driving signals in the pressure sensing period and frequencies of the second driving signals in the pressure sensing period are different from each other;
    the frequencies of the second driving signals in the pressure sensing period are greater than zero; and
    the frequencies of the first driving signals in the display period are greater than zero.

12. The method of claim 11, further comprising:
    detecting a position of a touch using first sensing signals output from the touch sensor during the display period; and
    detecting a pressure of the touch using second sensing signals output from the touch sensor during the pressure sensing period.

13. The method of claim 11, further comprising
    detecting a position of a touch using first sensing signals output from the touch sensor during the display period, and detecting a position of a touch and a pressure of the touch by performing frequency separation on second sensing signals output from the touch sensor during the pressure sensing period.

14. The method of claim 11, wherein the touch sensor is located on the display panel, and comprises a plurality of touch electrodes.

15. The method of claim 14, wherein at least some of the touch electrodes and at least some of the data lines overlap with each other.

16. The method of claim 11, wherein the touch sensor comprises a capacitive type touch sensor.

* * * * *